United States Patent [19]

Tomita et al.

[11] E Patent Number: Re. 32,498

[45] Reissued Date of Patent: Sep. 8, 1987

[54] METHOD OF MANUFACTURING FLUORESCENT SCREENS OF CATHODE RAY TUBES

[75] Inventors: Yoshifumi Tomita; Hiromitsu Nakai, both of Mobara, Japan

[73] Assignee: Hitachi, Ltd., Tokyo, Japan

[21] Appl. No.: 752,359

[22] Filed: Jul. 5, 1985

Related U.S. Patent Documents

Reissue of:

[64] Patent No.: 4,391,885
Issued: Jul. 5, 1983
Appl. No.: 361,269
Filed: Mar. 24, 1982

[30] Foreign Application Priority Data

Mar. 27, 1981 [JP] Japan ..... 56-43919

[51] Int. Cl.[4] ..... G03C 5/00

[52] U.S. Cl. ..... 430/28; 427/53.1; 427/64; 427/68

[58] Field of Search ..... 430/28, 26, 25; 427/53.1, 64, 68

[56] References Cited

U.S. PATENT DOCUMENTS 4,247,612 1/1981 Nishizawa et al. ..... 430/28
4,269,918 5/1981 Nonogaki et al. ..... 430/28
4,273,842 6/1981 Nonogaki et al. ..... 430/28 X
4,318,971 3/1982 Nishizawa et al. ..... 430/28
4,331,752 5/1982 Yokomizo et al. ..... 430/28

*Primary Examiner*—John H. Newsome
*Attorney, Agent, or Firm*—Charles E. Pfund

[57] ABSTRACT

A fluorescent screen of a cathode ray tube is prepared by forming a film of photosensitive sticky substance, for example, an aqueous solution of a copolymer of a complex salt of diazonium salt and zinc chloride, on an inner surface of a face plate of the tube, exposing the film to light to render portions thereof sticky, applying a powdery substance, for example, [phosphors of three colors] *graphite*, onto the film to cause the powdery substance to adhere to the portions of the film rendered sticky, removing excess powder to form a film pattern of the powdery substance, causing the substance responsible for stickiness to ooze out onto the film pattern, applying another powdery substance, for example, [graphite] *titanium oxide* onto the film pattern and removing an excess of another powder substance, thus forming the fluorescent screen. The invention is applicable to the manufacture of a fluorescent screen for use in a color picture tube, a monochromatic picture tube and a penetration tube.

9 Claims, 4 Drawing Figures

METHOD OF MANUFACTURING FLUORESCENT SCREENS OF CATHODE RAY TUBES

Matter enclosed in heavy brackets [ ] appears in the original patent but forms no part of this reissue specification; matter printed in italics indicates the additions made by reissue.

*This is a reissue of application Ser. No. 361,269 filed Mar. 24, 1982, now U.S. Pat. No. 4,391,885.*

BACKGROUND OF THE INVENTION

This invention relates to a method of manufacturing a fluorescnt screen, particularly of a multilayer construction of a cathode ray tube.

Multilayer fluorescent screen has been used in various types of cathode ray tubes. For example, in a penetration tube, two or three phosphor layers emitting light of different colors are laminated with nonluminous layers interleaved. In many cathode ray tubes, an aluminum film, called a metal back, is formed on the side of a fluorescent screen facing an electron gun structure. In such a case, a filming layer acting as a substrate is formed on the fluorescent screen.

To prepare such a multilayer construction, various techniques have been used for different purposes. These techniques, however, require complicated steps, thus requiring complicated installations, increasing manufacturing cost and decreasing yielding rate.

[BACKGROUND] *SUMMARY* OF THE INVENTION

It is, therefore, an object of this invention to provide a novel method of manufacturing a fluorescent screen of a cathode ray tube capable of readily manufacturing a fluorescent screen of a multilayer construction.

According to this invention, there is provided a method of manufacturing a fluorescent screen of a cathode ray tube comprising the steps of: forming a film of photosensitive substance that exhibits stickiness when exposed to light on an inner surface of a face plate of the tube; exposing the film to light to render portions thereof sticky; applying a powdery substance onto the film to cause the substance to adhere to the portions of the film rendered sticky; removing excess powder to form a film pattern of the powdery substance; causing the substance responsible for stickiness to ooze out onto the film pattern; applying another powdery substance onto the film pattern; and removing excess of *said* another powdery substance, thus forming the fluorescent screen.

DESCRIPTION OF THE PREFERRED EMBODIMENT

Figure 1A:
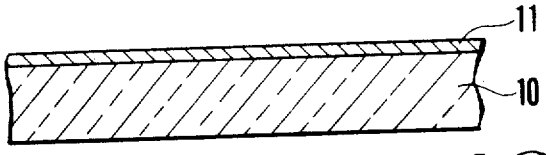
FIGS. 1a to 1d illustrate a preparation process of a fluorescent screen according to the present invention.
Figure 1B:
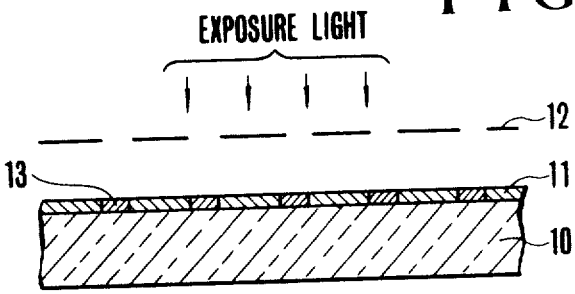
Figure 1C:
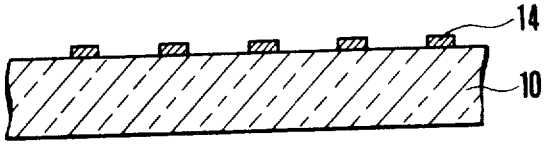
Figure 1D:
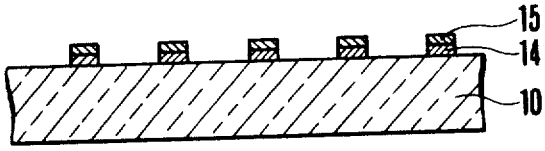

An aqueous solution of a polymer of a complex salt of diazonium salt and zinc chloride is coated on a substrate 10 of glass or the like (FIG. 1a). When the film 11 is dried and then partly irradiated with light through an apertured mask 12, zinc chloride formed as a result of photodecomposition absorbs moisture so that portions 13 of the film exposed to light becomes sticky (FIG. 1b). A dry powder is sprayed on the film in this state and excess powder is removed by compressed air to form a desired pattern 14 of the powder on the film (FIG. 1c). When the film is left [standstill] *stationary*, the substance responsible for stickiness or sticky liquid rises along the surfaces of the particles that constitute the film owing to capillary phenomenon, and when the film is sufficiently thin, the sticky liquid would ooze out to the top surface of the film with the result that the film itself manifests stickiness. When another type of powder is applied to such a sticky film and excess particles are blown away with air, a second film 15 of another type of the powder is formed on the first film (FIG. 1d). When the second film is sufficiently thin the sticky liquid further oozes out to the surface of the second film so that still another powder can be applied. The above preparation process can be repeated until the sticky liquid does not ooze out to prepare a multilayer film. Where a photosensitive sticky substance is coated on the substrate to a sufficient thickness and the amount of exposure light is increased, the amount of the sticky liquid increases so that it is possible to increase the number of layers. Accordingly, the number of layers can be determined as desired by varying the thickness and concentration of the photosensitive sticky substance and the amount of exposure light.

For better understanding of the invention, the following examples are given.

EXAMPLE 1

An aqueous solution of a photosensitive sticky substance having the following composition was coated on the inner surface of the panel glass of the color picture tube and the thickness of the film was adjusted to 0.5 to 0.8 microns with a conventional rotary spinning machine, followed by drying.

| | |
|---|---|
| arginic acid-polypropylene glycol ester | 0.2 wt. % |
| polyvinyl alcohol | 0.06 wt. % |
| P—dimethyl aminobenzene diazonium chloride, zinc chloride | 3.3 wt. % |
| water | balance |

After mounting a stripe shadow mask, portions of the film *other than the portion* approximately corresponding to locations for three colors of green, blue and red *stripes* were successively exposed to light. At this time, the position of a light [force] *source was shifted* from the ordinary positions of the light source for exposure of portions at which stripes of phosphors of respective colors are to be formed, by half the distance between the positions in a direction perpendicular to the stripes. After exposure, the shadow mask was dismounted and a fine powder of graphite having a particle size of 0.2 to 0.3 microns was sprayed and excess powder was removed by compressed air, thus forming an ordinary black matrix stripe. After one minute, sticky liquid created by the previous exposure oozed out onto the *surface of the* black matrix stripe. Then, a fine powder of titanium oxide having a particle size of 0.1 to 0.2 microns was applied and excess powder was removed by compressed air to form titanium oxide layer acting as a reflection layer on the graphite layer. Thereafter, the film was exposed to light in a conventional manner to form phosphor stripes of three colors *between black matrix stripes*. Conventional steps were followed to complete a fluorescent screen.

EXAMPLE 2

This example concerns manufacture of a penetration tube. Firstly, an aqueous solution of photosensitive sticky substance having the same composition as in Example 1 was applied to the inner surface of a face plate of the tube to a thickness of 1 to 1.5 microns, the resulting film was dried and then uniformly exposed to light. A powder of phosphor acting as a blue phosphor and consisting of zinc sulfide and silver and having a particle size of about 0.1 micron was sprayed to a thickness of about 0.9 microns and excess powder was removed by compressed air. The assembly was left standstill for about one minute to cause the sticky liquid to ooze out. Then, a powder of silica having a particle size of about 0.05 microns was applied to a thickness of about 0.25 microns and excess powder was removed by compressed air to form silica films acting as barriers for increasing the potential difference between phosphor layers. The assembly was left [standstill] *stationary* for one minute to cause the sticky liquid to ooze out. Then, a powder of green phosphor consisting of zinc silicate and manganese was applied to a thickness of about 0.25 microns and then developed. The assembly was left [standstill] *stationary* for 30 seconds, and then in the same manner as described above, a powder of silica was applied to a thickness of about 0.7 microns to form a silica film. Then, the assembly was left standstill for one minute, and a powder of red phosphor having a particle size of 0.1 micron and consisting of silicates of magnesium, cadmium and zinc, and manganese was applied to a thickness of about 0.5 microns to form a multilayer construction, followed by predetermined steps to obtain a fluorescent screen.

EXAMPLE 3

An aqueous solution of the photosensitive sticky substance, the same as that of Example 1, was coated to a thickness of about 0.5 to 0.6 microns on the inner surface of the face plate of a monochromatic cathode ray tube and then dried. After uniformly exposing the resulting film to light, a powder of white phosphor having a particle size of about 7 to 8 microns and consisting of a mixture of zinc sulfide-silver, zinc sulfide-copper, and aluminam was sprayed to a thickness of about 15 to 20 microns, and excess powder was removed with compressed air. After the assembly was left [standstill] *stationary* for two minutes, a fine powder of [isobuthyl] *isobutyl* methacrylate resin having a particle size of about 0.05 microns was applied to a thickness of about 5 microns and the resulting film was then developed. Thereafter, the face plate was heated to 85° C. to fuse together the particles of the resin for forming a continuous film acting as a filming layer on the phosphor film, followed by predetermined steps to obtain a fluorescent screen.

It should be understood that the foregoing examples show only few examples of the method of this invention for preparing a fluorescent screen of a multilayer construction, and that various types of fluorescent screens can be prepared by adjusting the quantity of the sticky liquid by varying the quantity of the applied photosensitive sticky substance and the quantity of exposure light, or by changing the combination of the powdery substances. For example, the filming layer described in Example 3 can also be applied following the steps described in Examples 1 and 2.

As described above, according to the method of manufacturing a fluorescent screen of a cathode ray tube of this invention, a film of photosensitive sticky substance is exposed to light to render it sticky, then powders of various substances are applied to the sticky film, and excess powders are removed to develope. After the sticky liquid has oozed out to the surface of the film, another powder is applied again and then developed. In this manner, a multilayer fluorescent screen having any desired number of layers and consisting of different materials can readily be prepared until the sticky liquid does not ooze out any more.

What is claimed is:

1. A method of manufacturing a fluorescent screen of a cathode ray tube comprising the steps of:

forming a film of photosensitive [sticky] substance that exhibits stickiness when exposed to light on an inner surface of a face plate of said tube;

exposing said film to light to render portions thereof sticky;

applying a powdery substance onto said film to cause said powdery substance to adhere to said portions of the film rendered sticky;

removing excess powder to form a film pattern of said powdery substance;

causing the substance responsible for stickiness to ooze out onto said film pattern;

applying another powdery substance onto said film pattern; and removing an excess of said another powdery substance, thus forming said fluorescent screen.

2. The method according to claim 1 wherein said photosensitive [sticky] substance comprises a compolymer of a complex salt of diazonium salt and zinc chloride.

3. The method according to claim 1 wherein said film of photosensitive [sticky] substance has a thickness of about 0.5 to 0.8 microns.

4. The method according to claim 1 wherein said powdery substance comprises [powders] *a powder* of phosphors of *one of* three colors of green, blue and red.

5. The method according to claim [1] *4* wherein said another powdery substance comprises a powder of [graphite] *silica.*

6. The method according to claim 5 which further comprises the step of applying a powder of [white substance onto a film of graphite to form a reflection layer] *a phosphor of a second of said three colors.*

7. The method according to claim [1] *6* wherein [said] *a second* another powdery substance [comprises] *comprising* a powder of silica *is applied to said phosphor of said second color.*

*8. A method according to claim 1 wherein said powdery substance comprises a powder of graphite and said another powdery substance comprises a powder of titanium oxide.*

*9. The method according to claim 1 wherein said powdery substance is a powder of a phosphor and said another powdery substance comprises an isobutyl methacrylate resin.*

* * * * *